(12) United States Patent
Chavali et al.

(10) Patent No.: US 12,062,551 B2
(45) Date of Patent: Aug. 13, 2024

(54) HIGH DENSITY ORGANIC INTERCONNECT STRUCTURES

(71) Applicant: Intel Corporation, Santa Clara, CA (US)

(72) Inventors: Sri Chaitra Jyotsna Chavali, Chandler, AZ (US); Siddharth K. Alur, Chandler, AZ (US); Lilia May, Chandler, AZ (US); Amanda E. Schuckman, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/118,835

(22) Filed: Mar. 8, 2023

(65) Prior Publication Data

US 2023/0223278 A1   Jul. 13, 2023

Related U.S. Application Data

(63) Continuation of application No. 17/521,406, filed on Nov. 8, 2021, now Pat. No. 11,631,595, which is a
(Continued)

(51) Int. Cl.
*H01L 21/48* (2006.01)
*H01L 23/498* (2006.01)

(52) U.S. Cl.
CPC .... *H01L 21/4857* (2013.01); *H01L 23/49822* (2013.01); *H01L 23/49827* (2013.01)

(58) Field of Classification Search
CPC ........... H01L 21/4857; H01L 23/49822; H01L 23/49827
See application file for complete search history.

(56) References Cited

U.S. PATENT DOCUMENTS 10,685,850 B2   6/2020   Chavali et al.
2011/0089573 A1   4/2011   Kurita
(Continued)

FOREIGN PATENT DOCUMENTS

JP         2012114431 A    6/2012
WO   WO-2018004618 A1    1/2018

OTHER PUBLICATIONS

"U.S. Appl. No. 16/305,743, Notice of Allowance mailed Feb. 10, 2020", 10 pgs.
(Continued)

*Primary Examiner* — Elias Ullah
(74) *Attorney, Agent, or Firm* — Akona IP PC (57) ABSTRACT

Generally discussed herein are systems, devices, and methods that include an organic high density interconnect structure and techniques for making the same. According to an example a method can include forming one or more low density buildup layers on a core, conductive interconnect material of the one or more low density buildup layers electrically and mechanically connected to conductive interconnect material of the core, forming one or more high density buildup layers on an exposed low density buildup layer of the one or more low density buildup layers, conductive interconnect material of the high density buildup layers electrically and mechanically connected to the conductive interconnect material of the one or more low density buildup layers, and forming another low density buildup layer on and around an exposed high density buildup layer of the one or more high density buildup layers.

20 Claims, 8 Drawing Sheets

Related U.S. Application Data continuation of application No. 16/901,172, filed on Jun. 15, 2020, now Pat. No. 11,195,727, which is a continuation of application No. 16/305,743, filed as application No. PCT/US2016/040481 on Jun. 30, 2016, now Pat. No. 10,685,850.

(56) References Cited

U.S. PATENT DOCUMENTS

| | | |
|---|---|---|
| 2015/0001738 A1 | 1/2015 | Shimizu et al. |
| 2015/0084210 A1 | 3/2015 | Chiu et al. |
| 2015/0340353 A1 | 11/2015 | Starkston et al. |
| 2019/0221447 A1 | 7/2019 | Chavali et al. |
| 2020/0312675 A1 | 10/2020 | Chavali et al. |
| 2022/0059367 A1 | 2/2022 | Chavali et al. |

OTHER PUBLICATIONS

"U.S. Appl. No. 16/305,743, Preliminary Amendment filed Nov. 29, 2018", 9 pgs.

"U.S. Appl. No. 16/901,172, Notice of Allowance mailed Aug. 6, 2021", 8 pgs.

"U.S. Appl. No. 16/901,172, PTO Response to Rule 312 Communication mailed Nov. 3, 2021", 2 pgs.

"U.S. Appl. No. 17/521,406, Notice of Allowance mailed Dec. 15, 2022", 7 pgs.

"International Application Serial No. PCT/US2016/040481, International Preliminary Report on Patentability mailed Jan. 10, 2019", 12 pgs.

"International Application Serial No. PCT/US2016/040481, International Search Report mailed Apr. 26, 2017", 3 pgs.

"International Application Serial No. PCT/US2016/040481, Written Opinion mailed Apr. 26, 2017", 10 pgs.

HIGH DENSITY ORGANIC INTERCONNECT STRUCTURES

CROSS-REFERENCE TO RELATED APPLICATION

This application is a continuation of U.S. patent application Ser. No. 17/521,406, filed Nov. 8, 2021, which is a continuation of U.S. patent application Ser. No. 16/901,172, filed Jun. 15, 2020, now issued as U.S. Pat. No. 11,195,727, which is a continuation of U.S. patent application Ser. No. 16/305,743, filed Nov. 29, 2018, now issued as U.S. Pat. No. 10,685,850, which is a U.S. National Stage Filing under 35 U.S.C. 371 from International Application No. PCT/US2016/040481, filed on Jun. 30, 2016, each of which application is incorporated herein by reference in its entirety.

TECHNICAL FIELD

Embodiments generally relate to packages that can include high density routing in a substrate. Some embodiments can include a device with high density routing therein. In one or more embodiments, a localized high density interconnect structure can be surrounded (e.g., completely) by inorganic materials.

TECHNICAL BACKGROUND

Semiconductor devices, such as electronic devices, can include substrate routing that is of a lower density than some of the routing in a chip that is attached to the substrate. Such devices can include complex routing schemes especially in areas where the attached chip includes higher density routing than the routing in the substrate.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DESCRIPTION OF EMBODIMENTS

Examples in this disclosure relate to devices and systems that include a high density interconnect structure embedded in a substrate. Examples also relate to techniques of making the systems and devices.

The following description includes terms, such as upper, lower, first, second, etc. that are used for descriptive purposes only and are not to be construed as limiting. The examples of an apparatus, device, or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer and wafers may be made of semiconducting, non-semiconducting, or combinations of semiconducting and non-semiconducting materials.

Current board design can be created by incorporating a number of heterogeneous functions, such as Computer Processing Unit (CPU) logic, graphics functions, cache memory, and other functions to create integrated System on Chip (SoC) designs. Such SoC packages can lower the complexity of a product design and can reduce the number of components required by the product. Picking individual packages that implement these functions and designing the board around the packages chosen can be complex. Using individual packages can increase the system board area, power loss, complexity, component count, or costs over an integrated SoC package solution.

The input/output (I/O) density in a package substrate can be a function of a substrate's minimum pad size, minimum trace dimensions, minimum space dimensions, and/or the capability of the manufacturing process. The routing density in a multichip substrate can be several orders of magnitude lower (e.g., about 100 times) than chip level routing density. This routing density can impact cost, size, and performance of a product.

A way to reduce the size of a product can include utilizing a silicon interposer in a package to provide a high density chip-to-chip interconnect. Such a solution includes a higher cost, such as can be due to the cost of the silicon interposer, additional assembly and process steps, and/or compounding yield loss.

A substrate can include a high density interconnect structure in a bumpless buildup layer (BBUL) or other substrate. Such a solution can allow a high density interconnect structure to be situated where it would be advantageous to include higher density interconnect routing and allow lower density interconnect routing (e.g., routing with a substrate routing technique) where such lower density routing may be advantageous, such as for routing power or ground lines.

Substrate routing can take up a significant amount of space and can be a factor in the overall size of a die package. By including routing created using typical substrate routing techniques, which generally results in less dense routing than chip routing techniques, there may not be enough space to route signals from the die without routing through the die. Integrating a high density interconnect structure in a package or substrate, such as a BBUL package or substrate, can allow for an increase in overall routing and interconnect density of a package, thus helping to reduce size and cost.

One previous solution included embedding a high density, silicon interconnect device in a substrate. Assembly of such a package can be challenging due to tight tolerance requirements in x, y, and z directions. The tight tolerance requirements are due, at least in part, to alignment and fitting issues in connecting the chip interconnect device to the substrate. In addition, using a chip interconnect device (e.g., a silicon interconnect device) can include embedding the interconnect device during the substrate fabrication process.

High speed communication between a central processing unit (CPU) package and a memory package in a multi-chip package (MCP) substrate can be a challenging area of development. This challenge can be made more difficult using materials with low signal loss. Multiple advancements in faster signal transfer speeds have led to technologies such as EmIB™ (embedded interconnect bridge), developed by Intel Corporation of Santa Clara, California, United States, and stacked die (2.5D, 3D). Multiple other open source appropriate technologies (OSATs) have been developed to help increase signal transfer speeds.

Apart from reliability challenges due to an embedded die, the construction of current EmIB™ architecture allows for vertical connections on only a single side of the high density interconnect structure. Since, in using EmIB™, the high density interconnect structure is embedded in the substrate using a die backside film (DBF) layer, the routing is limited to only a single side of the high density interconnect device. The design limits the signal transfer from the bottom of the high density interconnect device. Such interconnect structures do not provide a manner of electrically forming connections with the bottom side of the EmIB™ structure. It can be advantageous to include a signal path through the EmIB™ structure. Thus, it could be advantageous to develop a cost-effective process of creating a high density interconnect structure with electrical connections on opposing surfaces of the high density interconnect structure. Having high density routing on every layer and entire area of the substrate may not be necessary for some applications. If some part of the substrate can include high density routing, such as can include a flip chip ball grid array (FCBGA), while the rest of the substrate maintains printed circuit board (PCB)-like density routing, the overall cost and/or complexity of the substrate can be reduced.

Other solutions to including higher density signal routing through a high density interconnect device can include a 2.5D/3D die stack approach, which involves expensive and tedious process of through silicon vias (TSVs) that can impact cost of the substrate.

Devices, systems, and/or processes discussed herein can help in solving at least two issues: (1) opposing surface interconnection capability on the high density interconnect structure, such as to allow signal communication between two actives (e.g., one device coupled to each opposing surface of the high density interconnect device), such as to provide more package design flexibility, and (2) providing a localized high density routing region within a low density (cheaper) density routing substrate, such as to provide at least some cost mitigation.

Enabling of localized high density (HD) vertical interconnect structure within low density substrate can be driven by an ability to develop and use either: (1) implementation of photo-imagable dielectric (PID) materials where HD patterning will be used, and development and removal of PID material in non-HD zones (e.g., in lower density routing zones) or (2) formation of a release layer to selectively build lower and higher density substrate layers in locations of interest.

Use of a vertical interconnect localized HD-organic device, unlike EmIB™, provides design flexibility to route through the HD-organic device to layers below the HD-organic bridge as well as the layers above the HD-organic bridge. The use of PID or other build up (BU) material, as compared to a silicon (Si) die, provides an advantage to mechanical reliability through thermal cycling. This can be due, at least in part, to improved crack resistance/higher toughness of polymer materials over the more rigid silicon materials of the Si die. The vertical interconnect design does not generally have the challenges related to stress cracks that can form when using the EmIB™ structure.

To summarize, the proposed architecture can have one or more of the following advantages over EmIB™ and other high density interconnect structures: (1) Improved signal routing in all directions within the package, especially in the direction below the high density interconnect device, (2) Fewer crack related concerns due to better mechanical properties of organic BU/PID materials over Si materials, (3) No need to share active/passive dies with the substrate suppliers, and/or (4) Thin layers of routing possible with no general effect on substrate/panel warpage related, such as can be due to low modulus of elasticity (E) of buildup (BU) and photo-imagable dielectric (PID) materials as compared to silicon (Si), that causes an inherent front to back (F/B) coefficient of thermal expansion (CTE) mismatch.

HD packaging has been typically achieved by Patch on Interposer (PoINT) or PoINT with cavity or skewed BU substrate. The 2.5 and 3D approaches involve multiple level interconnect assembly process, along with limitations on Z-height, the PoINT process can lead to panel level warpage due to imbalance in architecture. The whole area of any layer may not need high density packaging. Hence, the PoINT approach is further constraining.

The present idea specifically allows for HD-routing in a smaller area within a localized area and/or layer of the device, and hence can be a more flexible architecture as compared to other prior options. A localized high density interconnect structure formation process can be optimized for removing the non-HD zone vs. forming lithography based vias within the HD zone. One way to do so is to develop organic PID material in steps (e.g., first, the non-HD zone, then, the HD zone). An area, which can be important in this process flow, can include identifying a release layer that is not contaminated in a development solution, such as in case of PID or in case of desmear bath in case of BU film. When a material is in an acidic or basic solution wet chemistry baths like development chemistry bath for PID or desmear chemistry bath for BU, these release films can be dissolved or leaked into them and contaminate or reduce the bath life, which can adversely affect the PID or BU.

Reference will now be made to the drawings wherein like structures will be provided with like suffix reference designations. In order to show the structures of various examples clearly, the drawings included herein are diagrammatic representations of integrated circuit structures. Thus, the actual appearance of the fabricated structures, for example in a photomicrograph, may appear different while still incorporating subject matter of the illustrated examples. Moreover, the drawings show the structures to aid in understanding the illustrated examples.

Figure 1A:
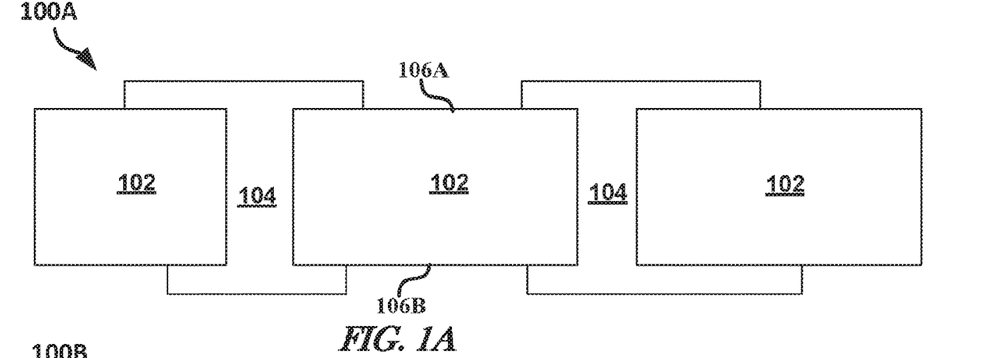
FIGS. 1A-1H illustrate stages of an example of a process of creating a device with a localized high density interconnect structure.

FIG. 1A illustrates, by way of example, a cross-section diagram of an embodiment of a device 100A. The device 100A as illustrated includes a core 102 with conductive interconnect material 104 in the core 102 and on a first surface 106A and a second surface 106B of the core 102. The core 102 can include a cured resin and glass cloth combination, ceramic, glass, thermoplastic material, a combination thereof, or other core material. The conductive interconnect material 104 can include a conductive material, such as copper, aluminum, tin, silver, gold, titanium, a combination thereof, or other conductive material. The conductive interconnect material 104 can provide a path for an electrical signal to travel through the core 102 (e.g., between the conductive interconnect material 104 on the first and second surfaces 106A-B of the core 102).

Figure 1B:
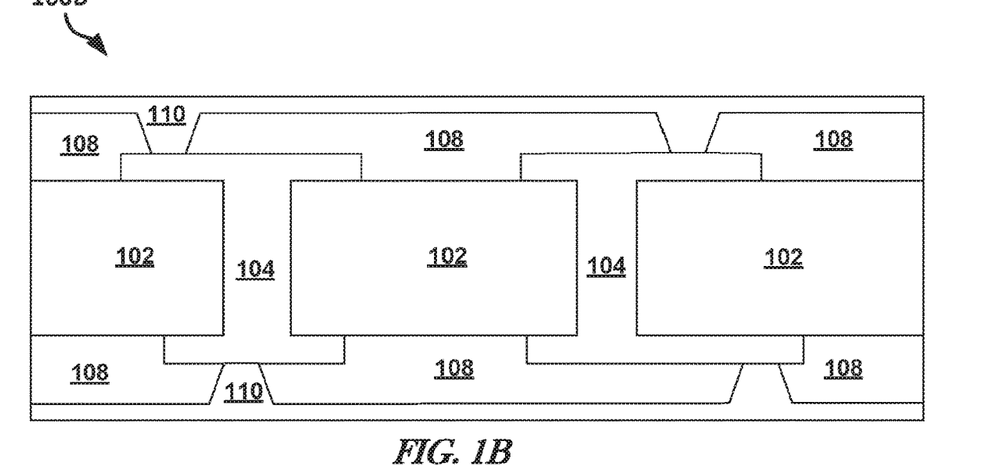

FIG. 1B illustrates, by way of example, a cross-section diagram of an embodiment of a device 100B that includes the device 100A with a first low density buildup layer (i.e. an inorganic buildup material 108 and a low density conductive interconnect material 110) situated on/over the top surface 106A and the bottom surface 106B of the core 102. The first low density buildup layer includes an inorganic buildup material 108 and a conductive interconnect material 110 in and on the buildup material 108. The buildup material 108 can include an Ajinomoto buildup film (ABF) or other buildup material including that of a sheet or liquid type. The conductive interconnect material 110 can include a material that is similar to the conductive interconnect material 104.

To form the device 100B, from the device 100A, the buildup material 108 can be situated on (e.g., laminated on) the core 102 and the conductive interconnect material 104. The buildup material 108 can then be cured. Via holes can be drilled through the buildup material 108, such as to expose a portion of the conductive interconnect material 104. The conductive interconnect material 110 can be plated in the via holes and on the buildup material 108.

Figure 1C:
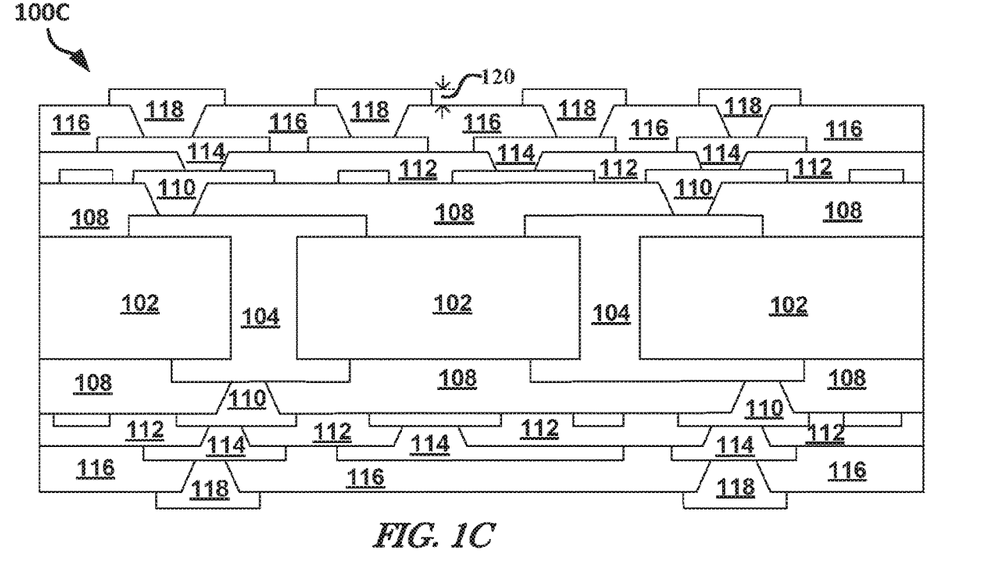

FIG. 1C illustrates, by way of example, a cross-section diagram of an embodiment of a device 100C that includes two more low density buildup layers (e.g., second and third low density buildup layers) on both sides of the device 100B after the conductive material 110 is etched. The second low density buildup layer includes an inorganic buildup layer 112 and conductive interconnect material 114. The third low density buildup layer includes an inorganic buildup material 116 and conductive interconnect material 118. Note that while the number of low density buildup layers on the top and bottom surface 106A-B of the core 102 are illustrated as being the same, the number of low density buildup layers on the top and bottom surfaces 106A-B of the core 102 can be the same or different. For example, the number of low density buildup layers on the top surface 106A can be N, where N is a positive integer, and the number of low density buildup layers on the bottom surface 106B can be M, where M is a positive integer different or the same as N.

The second and third low density buildup layers can be formed using the same process as the process used for forming the first low density buildup layer. Before forming the second and third low density buildup layers, the conductive interconnect material 110 can be etched to remove portions thereof and pattern the conductive interconnect material 110. After etching the conductive interconnect material 110 and before forming the second low density interconnect layer, the buildup material 108 can be cured a second time.

A height 120 of the conductive interconnect material 118 above the buildup material 116 can be greater than five microns. In one or more embodiments the height 120 can be greater than ten microns. In one or more other embodiments, the height 120 can be about or greater than fifteen microns or more.

Figure 1D:
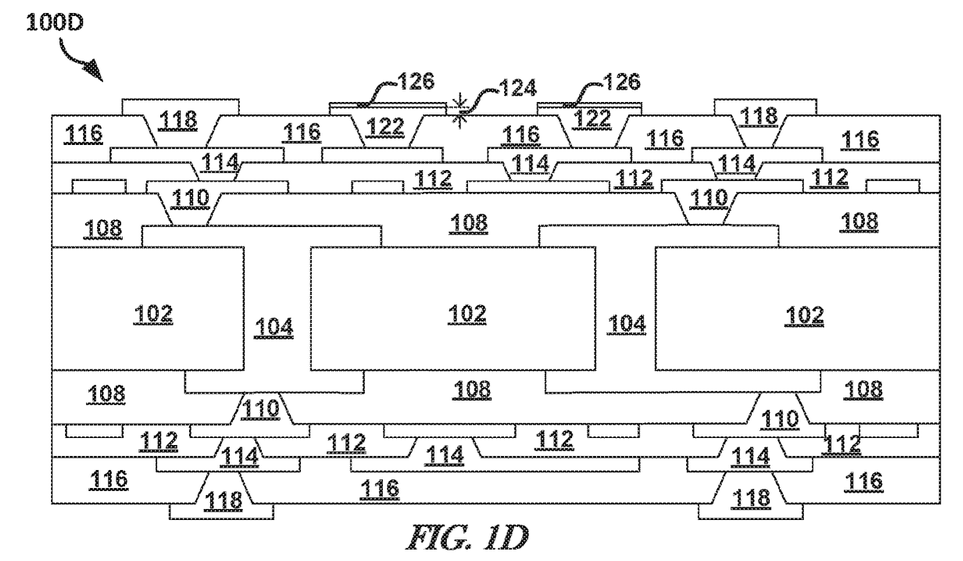

FIG. 1D illustrates, by way of example, a cross-section diagram of an embodiment of a device 100D that includes the device 100C after a grinding process has reduced the height 120 of at least some of the conductive interconnect material 118 to form the conductive interconnect material 122. A height 124 of the conductive interconnect material 122 can be less than fifteen microns, such as can be about ten microns, five microns, or other height less than the height 120. In one or more embodiments, the grinding can include a chemical mechanical planarization (CMP). The CMP is a technique of using chemical and mechanical forces to smooth a surface, such as can include chemical etching and abrasive polishing.

After the conductive interconnect material 122 is formed, an adhesion promoting material 126 can be situated on the conductive interconnect material 122. The adhesion promoting material 126 can include CZ, modified CZ, Novaband, Glicap, or a mechanically roughened surface to enhance a number of anchor points, or a chemical with a termination group that binds to the conductive surface on one end and the buildup film at another end. The adhesion promoting material 126 can help increase a bond strength between the conductive interconnect material 122 and an organic buildup material 128 (see FIG. 1E). Such an increased bond strength can help keep the organic buildup material height sufficiently small, such as to help reduce a form a factor of a resulting device. The heights of the conductive interconnect material 122 and 118 on the same low density buildup layer can be different. The height 124 of the conductive interconnect material 122 is less than the height 120 of the conductive interconnect material 118.

Figure 1E:
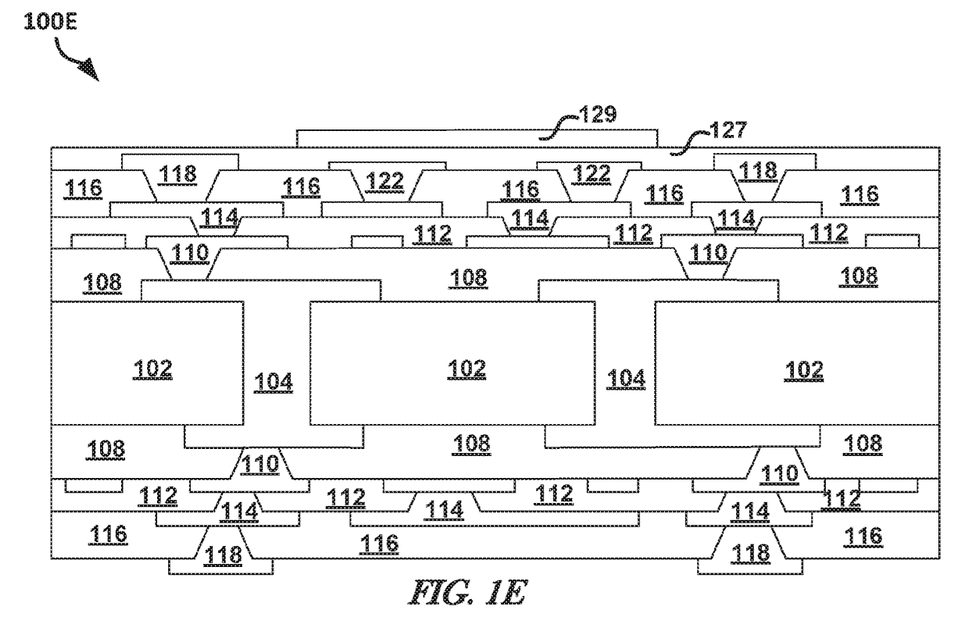

FIG. 1E illustrates, by way of example, a cross-section diagram of an embodiment of a device 100E that includes the device 100D after an organic buildup material 127 and a photo resist material 129 are situated on the device 100D. The buildup material 127 can include an organic material, such as can include an epoxy-based laminate composite, such as an Ajinomoto buildup film. The high density organic buildup material 127 can be situated using a lamination or other process. The photo resist material 129 can include a dry film or a liquid material. The photo resist material 129 can be situated using a lamination or coating process (if it is a liquid).

Figure 1F:
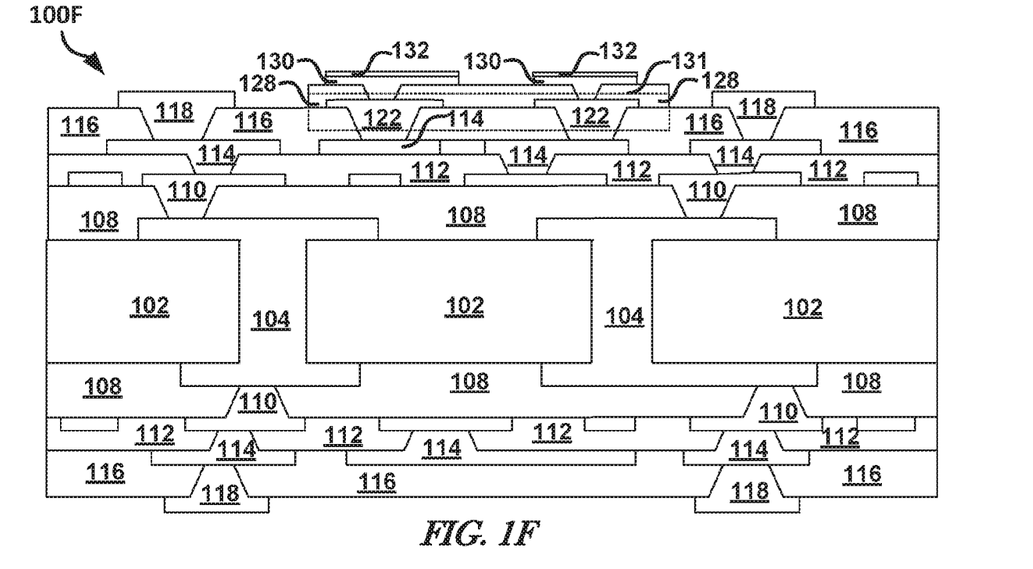

FIG. 1F illustrates, by way of example, a cross-section diagram of an embodiment of a device 100F that includes the device 100E after a first high density buildup layer (i.e. organic buildup material 128 and conductive interconnect material 130) is formed in a localized region of the device 100F. The organic buildup material 128 can include a PID.

To form the device 100F, from the device 100E, the buildup material 127 can be situated on (e.g., laminated on) the buildup material 116, the conductive interconnect material 122, and/or the conductive interconnect material 118. Portions of the buildup material 127 can be removed from the device 100E, such as by exposing and developing the portions of the organic buildup material 128 to be removed (i.e. portions of the buildup material 127 exposed by the photo resist material 129). The photo resist material 129 can be removed therefrom, such as by using an aqueous solution of sodium carbonate (Na2CO3) or tetramethylammonium hydroxide (TMAH). The remaining buildup material 128 can be cured. Via holes can be drilled into the remaining buildup material 128, such as to expose a portion of the conductive interconnect material 122. Then an electrolytic plating process can be used to create the conductive interconnect material 130. The electrolytic plating process can include depositing a seed layer on the buildup material 128 and exposed portions of the conductive interconnect material 122. A dry film resist (DFR) can be patterned on the seed layer, conductive material can be electrolytically plated around the DFR, and the conductive material can be etched to remove excess conductive interconnect material. The DFR can be stripped and an adhesion promoter 132 can be situated on exposed portions of the conductive interconnect material 130.

The dashed box 131 indicates a footprint region of the high density buildup layers. The conductive interconnect material within the dashed box 131 is generally the conductive interconnect material that can be reduced in height.

Figure 1G:
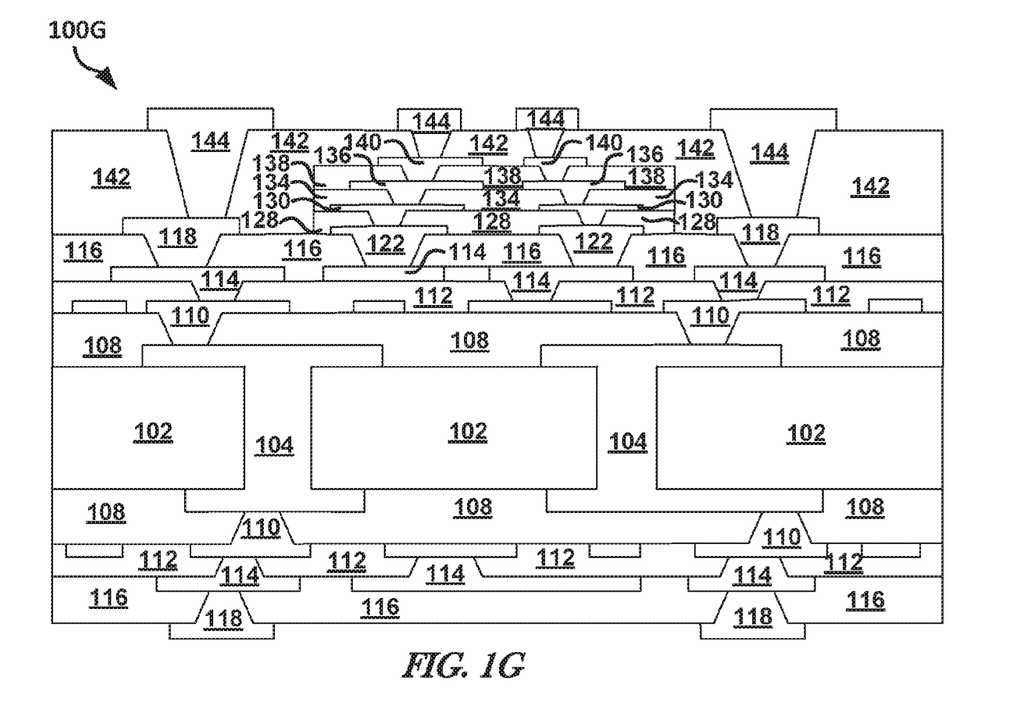

FIG. 1G illustrates, by way of example, a cross-section diagram of an embodiment of a device 100G that includes the device 100F after second and third high density buildup layers and a fourth low density buildup layer are formed on the device 100F. The second high density buildup layer includes an organic buildup material 134 and conductive interconnect material 136. The third high density buildup layer includes an organic buildup material 138 and conductive interconnect layer 140. The fourth low density buildup layer includes a fourth buildup material 142 and conductive interconnect material 144.

The second and third high density buildup layers can be formed using a same technique as described with regard to the first high density buildup layer. While the device 100G includes three high density buildup layers, any number of high density buildup layers greater than zero can be used. The high density buildup layers are localized, such as to provide high density interconnect routing in only a region of the device 100G.

The fourth low density buildup layer can be formed using a same technique as described with regard to the first low density buildup layer. The fourth buildup material 142 is situated on the third buildup material 116, conductive interconnect material 118, a top layer of the organic buildup material (e.g., the organic buildup material 136 of the device 100G), and a top layer of conductive interconnect material in a high density interconnect region (e.g., the conductive interconnect material 140 of the device 100G). The buildup material 142 can surround the high density interconnect region (i.e. all of the high density buildup layers, such as the first, second, and third high density buildup layers of the device 100G).

Figure 1H:
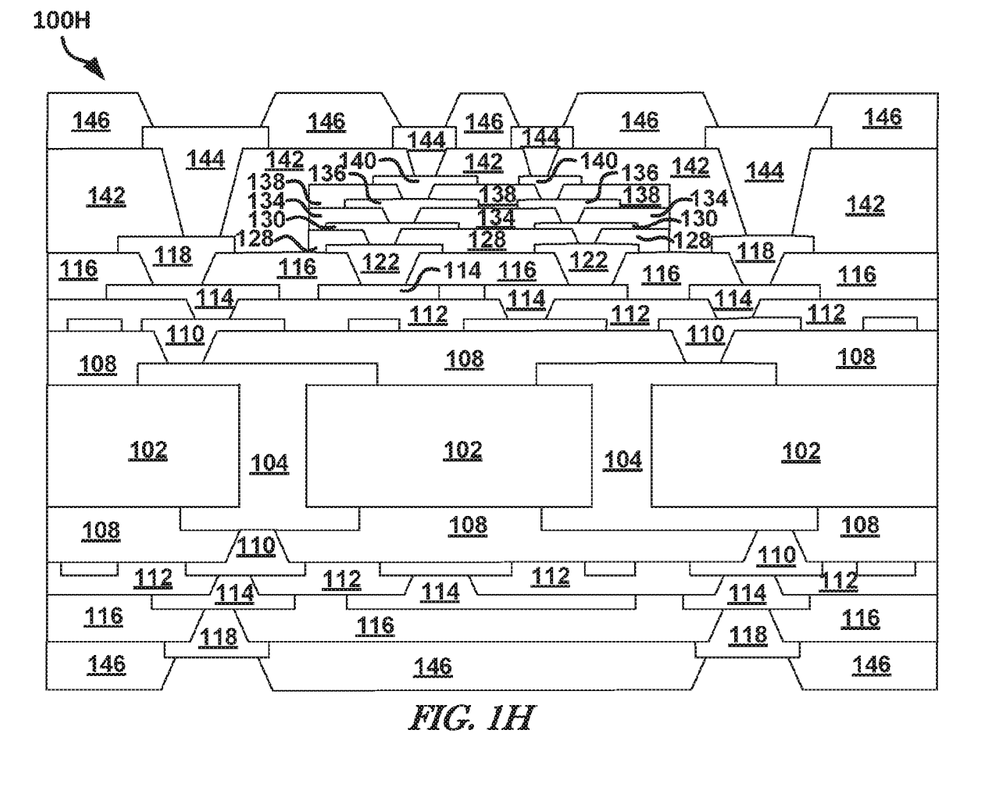

FIG. 1H illustrates, by way of example, a cross-section diagram of an embodiment of a device 100H that includes the device 100G after a solder resist 146 is laminated and patterned on both exposed surfaces of the device 100G. The solder resist 146 can be patterned to expose portions of the conductive interconnect material 144. The conductive interconnect material 144 and 118 can provide access to low density routing (i.e. conductive interconnect material in the low density buildup layers) and high density routing (e.g., conductive interconnect material in the high density buildup layers) in the device 100H. A die/chip/package can be attached to the device 100H, such as by electrically connecting pads of the die/chip/package to the conductive interconnect material 144 and/or 118. The solder resist 146 can include a photo-definable solder resist materials having epoxide, amines, and/or acrylic groups.

Figure 2A:
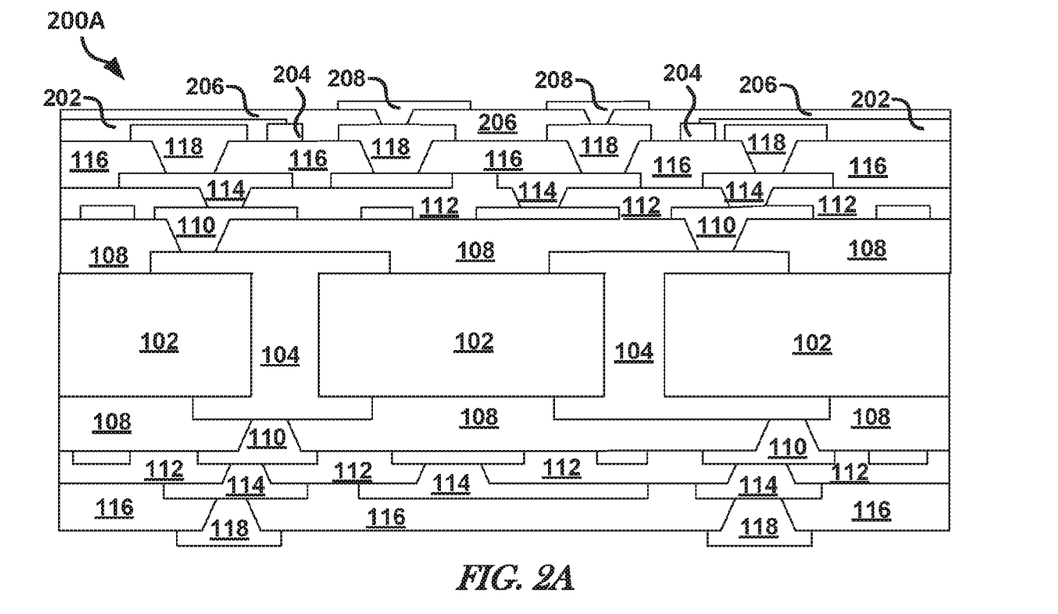
FIGS. 2A-2F illustrate stages of an example of a process for creating another device with a localized high density interconnect structure.

FIG. 2A illustrates, by way of example, a cross-section diagram of an embodiment of a device 200A that includes the device 100C after a sacrificial material 202 is situated on the third buildup material 116, the conductive interconnect material 118, a laser resist material 204, and a first high density buildup layer is formed on the third buildup material 116, the conductive interconnect material 118, the laser resist material 204, and the sacrificial material 202. The first high density buildup layer can be formed using a technique discussed with regard to FIG. 1E. The laser resist material 204 can include the same material as the conductive interconnect material 118 and can be patterned on the device at a same or different time as the conductive interconnect material 118. Other materials for the laser resist material 204 are possible.

Figure 2B:
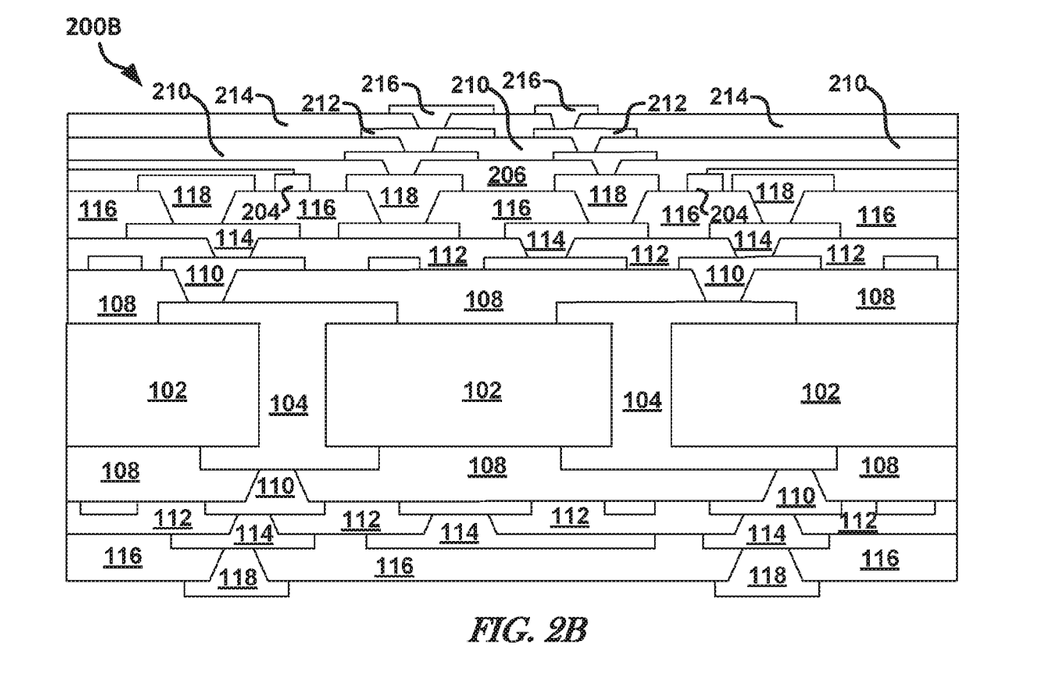

FIG. 2B illustrates, by way of example, a cross-section diagram of an embodiment of a device 200B that includes the device 200A after a second high density buildup layer (i.e. an organic buildup material 210 and conductive interconnect material 212) and third high density buildup layer (i.e. an organic buildup material 214 and conductive interconnect material 216) are formed on the first high density buildup layer and the sacrificial material 202. The second and third high density buildup layers can be formed using a technique similar to or the same as the technique used to form other high density buildup layers discussed herein.

Figure 2C:
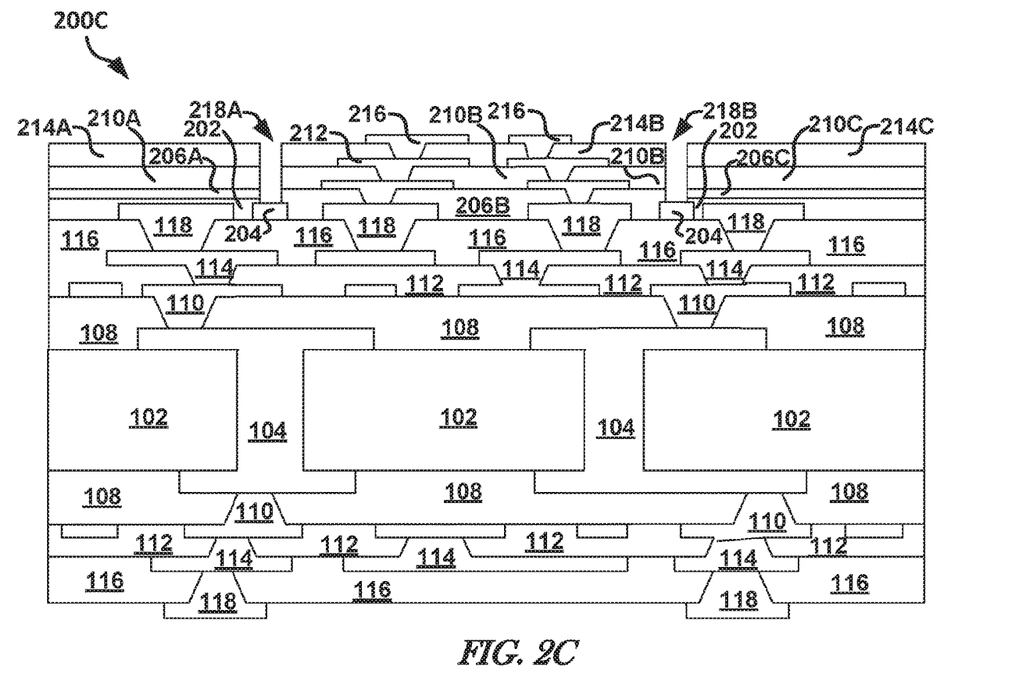

FIG. 2C illustrates, by way of example, a cross-section diagram of an embodiment of a device 200C that includes the device 200B after notches 218A and 218B are formed therein. The notches 218A-B divide the organic buildup materials 206, 210, and 214 into multiple respective sections (e.g., organic buildup material 206 is divided into organic buildup layer sections 206A, 206B, and 206C; organic buildup material 210 is divided into organic buildup layer sections 210A, 210B, and 210C; and organic buildup material 214 is divided into organic buildup layer sections 214A, 214B, and 214C as illustrated in FIG. 2C). The notches 218A-B isolate the sacrificial material 202 and any materials on the sacrificial material 202 from the remainder of the device 200C. The notches 218A-B can be formed using a laser to form the notch up to the laser resist material 204.

Figure 2D:
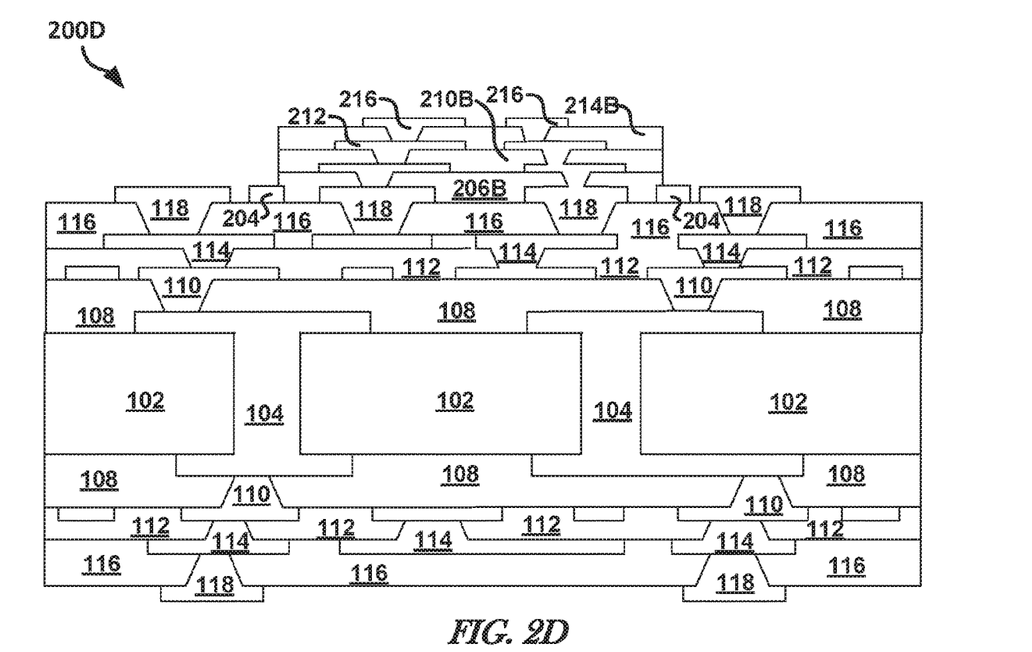

FIG. 2D illustrates, by way of example, a cross-section diagram of an embodiment of a device 200D that includes the device 200C after the sacrificial material 202 (and material on the sacrificial material 202) has been removed from the device 200C. Removing the sacrificial material 202 removes the organic buildup material sections 206A, 210A, 214A, 206C, 210C, and 214C, in the example of the device 200C. Removing the sacrificial material 202 can expose portions of the buildup material 116, the conductive interconnect material 118, and the laser resist material 204.

Figure 2E:
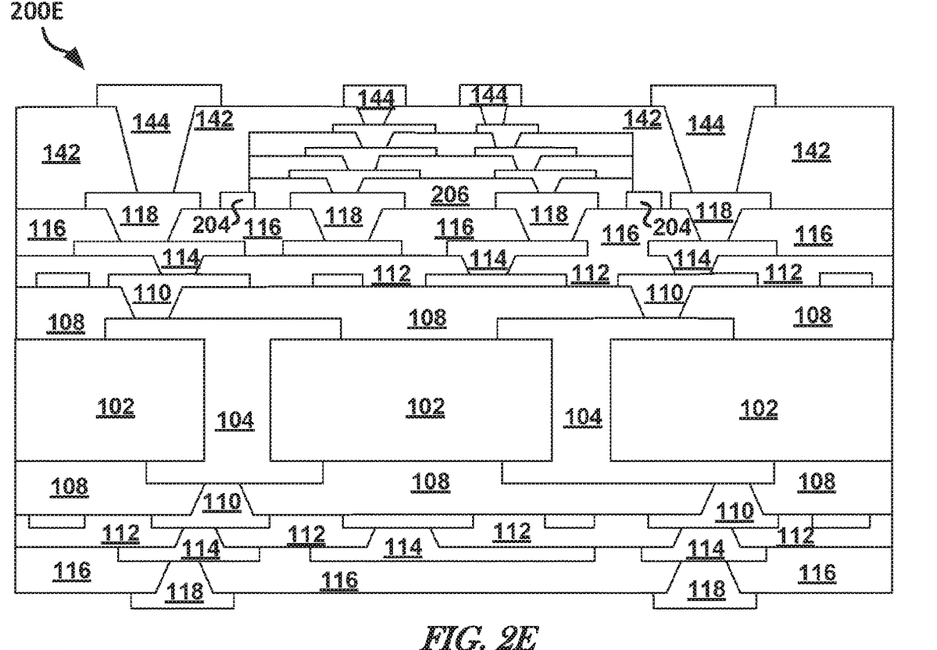

FIG. 2E illustrates, by way of example, a cross-section diagram of an embodiment of a device 200E that includes the device 200D after a fourth low density buildup layer is formed on the third high density buildup layer and the second low density buildup layer. The fourth low density buildup layer includes the buildup material 142 and the conductive interconnect material 144. The fourth low density buildup layer can be formed used a same or similar technique as is used to from other low density buildup layers discussed herein.

Figure 2F:
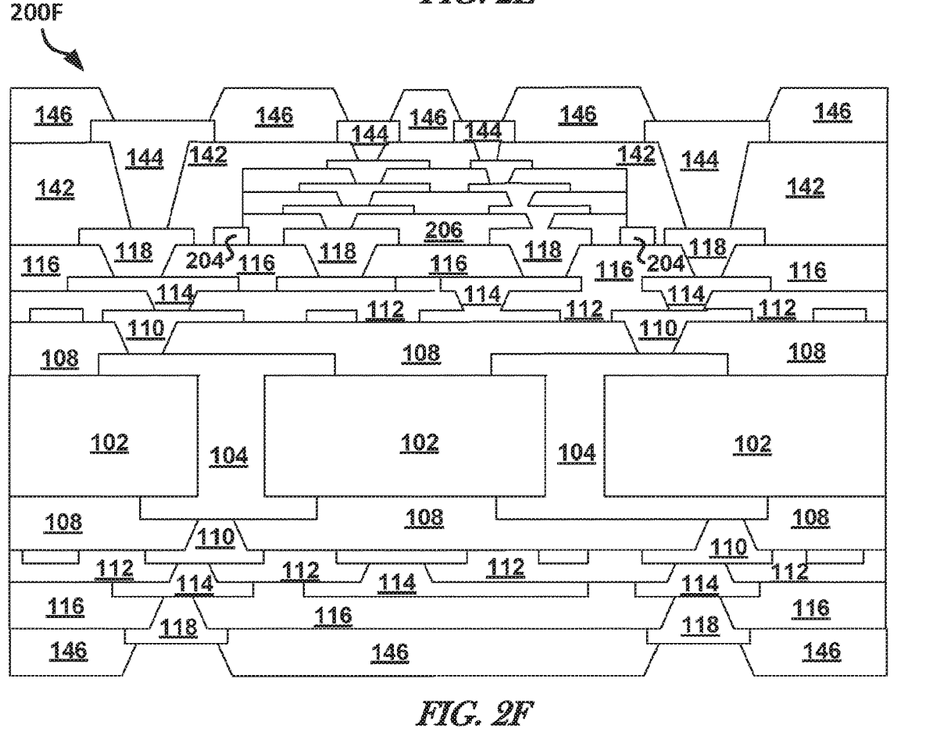

FIG. 2F illustrates, by way of example, a cross-section diagram of an embodiment of a device 200F that includes the device 200E after solder resist 146 has been formed on the device 200E. The solder resist 146 can be formed in the same manner as and include the same materials as the solder resist as discussed with regard to FIG. 1G. One or more dies/chips/packages can be electrically connected to the device 200F in a manner similar to that discussed with regard to the device 100G.

Note that while the description of the FIGS. discusses forming the buildup material (organic or other buildup layers) first, and then forming the conductive interconnect material on those layers, the conductive interconnect material can be deposited and formed before the buildup material, and the buildup material can be situated around the conductive interconnect material.

As used herein "low density" and "high density" are to be understood relative to one another. Low density means that it includes routing that is less dense than a corresponding high density. For example, a low density buildup layer includes routing (conductive interconnect material) that is less dense than routing a high density buildup layer. In one or more embodiments, high density routing is up to about one hundred times more dense than low density routing.

Figure 3:
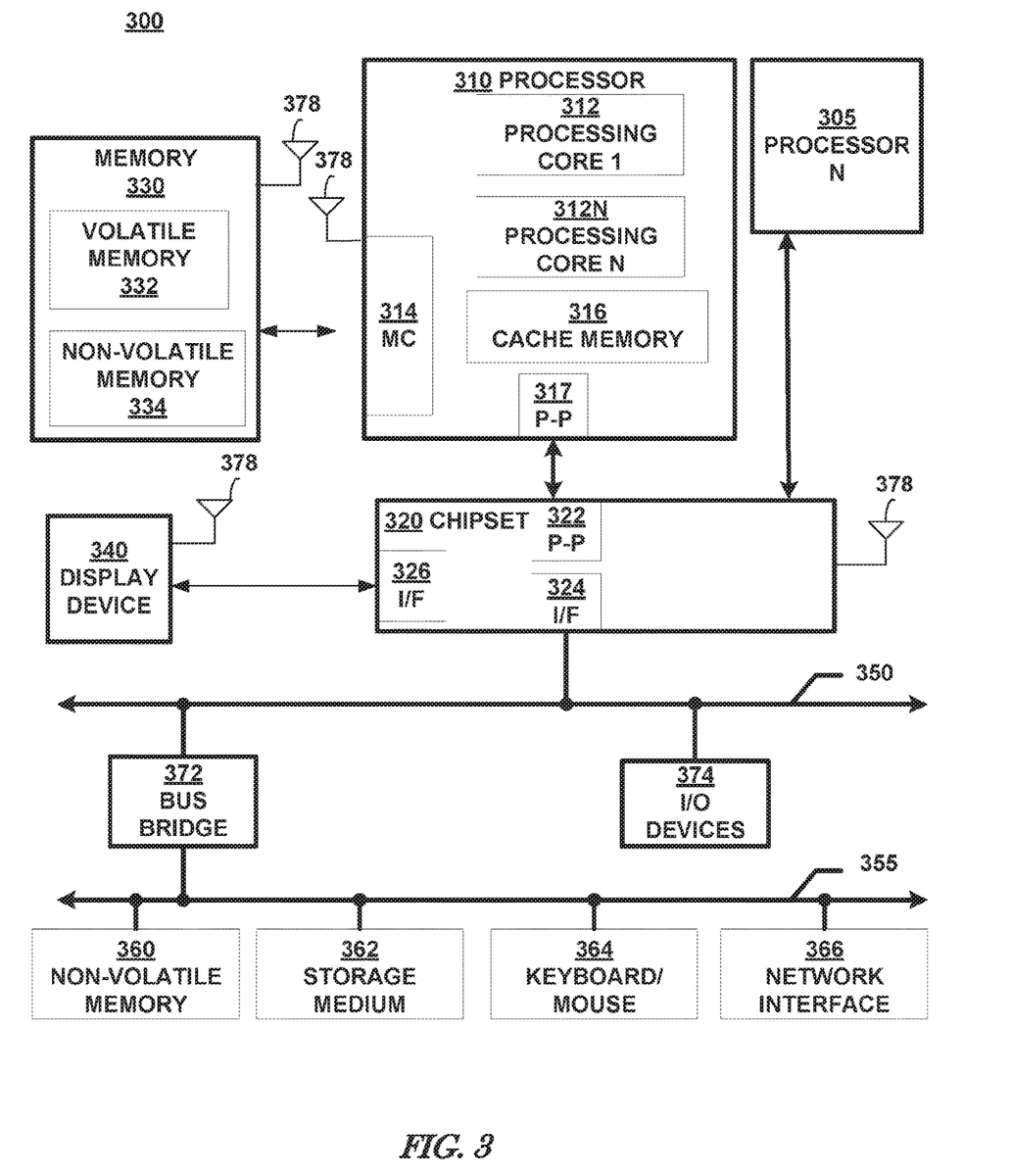
FIG. 3 is a schematic of an example of an electronic system in which a device as discussed herein can be used.

FIG. 3 illustrates, by way of example, a logical block diagram of an embodiment of system 300. In one or more embodiments, system 300 includes one or more components that can include a high density structure as discussed herein.

In one embodiment, processor 310 has one or more processing cores 312 and 312N, where 312N represents the Nth processor core inside processor 310 where N is a positive integer. In one embodiment, system 300 includes multiple processors including 310 and 305, where processor 305 has logic similar or identical to the logic of processor 310. In some embodiments, processing core 312 includes, but is not limited to, pre-fetch logic to fetch instructions, decode logic to decode the instructions, execution logic to execute instructions and the like. In some embodiments, processor 310 has a cache memory 316 to cache instructions and/or data for system 300. Cache memory 316 may be organized into a hierarchal structure including one or more levels of cache memory.

In some embodiments, processor 310 includes a memory controller 314, which is operable to perform functions that enable the processor 310 to access and communicate with memory 330 that includes a volatile memory 332 and/or a non-volatile memory 334. In some embodiments, processor 310 is coupled with memory 330 and chipset 320. Processor 310 may also be coupled to a wireless antenna 378 to communicate with any device configured to transmit and/or receive wireless signals. In one embodiment, the wireless antenna interface 378 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 332 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 334 includes, but is not limited to, flash memory, phase change memory (PCM), read-only memory (ROM), electrically erasable programmable read-only memory (EEPROM), or any other type of non-volatile memory device.

Memory 330 stores information and instructions to be executed by processor 310. In one embodiment, memory 330 may also store temporary variables or other intermediate information while processor 310 is executing instructions. In the illustrated embodiment, chipset 320 connects with processor 310 via Point-to-Point (PtP or P-P) interfaces 317 and 322. Chipset 320 enables processor 310 to connect to other elements in system 300. In some embodiments of the invention, interfaces 317 and 322 operate in accordance with a PtP communication protocol such as the Intel® QuickPath Interconnect (QPI) or the like. In other embodiments, a different interconnect may be used.

In some embodiments, chipset 320 is operable to communicate with processor 310, 305N, display device 340, and other devices. Chipset 320 may also be coupled to a wireless antenna 378 to communicate with any device configured to transmit and/or receive wireless signals.

Chipset 320 connects to display device 340 via interface 326. Display 340 may be, for example, a liquid crystal display (LCD), a plasma display, cathode ray tube (CRT) display, or any other form of visual display device. In some embodiments of the invention, processor 310 and chipset 320 are merged into a single SOC. In addition, chipset 320 connects to one or more buses 350 and 355 that interconnect various elements 374, 360, 362, 364, and 366. Buses 350 and 355 may be interconnected together via a bus bridge 372. In one embodiment, chipset 320 couples with a non-volatile memory 360, a mass storage device(s) 362, a keyboard/mouse 364, and a network interface 366 via interface 324 and/or 304, etc.

In one embodiment, mass storage device 362 includes, but is not limited to, a solid state drive, a hard disk drive, a universal serial bus flash memory drive, or any other form of computer data storage medium. In one embodiment, network interface 366 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the components shown in FIG. 3 are depicted as separate blocks within the system 300, the functions performed by some of these blocks may be integrated within a single semiconductor circuit or may be implemented using two or more separate integrated circuits. For example, although cache memory 316 is depicted as a separate block within processor 310, cache memory 316 (or selected aspects of 316) can be incorporated into processor core 312.

EXAMPLES AND NOTES

The present subject matter may be described by way of several examples.

Example 1 can include a method of making a device including forming one or more low density buildup layers on a core, the one or more low density buildup layers each including an inorganic buildup material and conductive interconnect material on and through the inorganic buildup material, the conductive interconnect material of the one or more low density buildup layers electrically and mechanically connected to conductive interconnect material of the core, forming one or more high density buildup layers on an exposed low density buildup layer of the one or more low density buildup layers, the one or more high density buildup layers each including an organic buildup material with conductive interconnect material on and through the organic buildup material, the conductive interconnect material of the high density buildup layers electrically and mechanically connected to the conductive interconnect material of the one or more low density buildup layers, and forming another low density buildup layer on and around an exposed high density buildup layer of the one or more high density buildup layers.

In Example 2, Example 1 can further include, wherein the organic buildup material includes a photo-imagable dielectric (PID), and wherein forming the one or more high density buildup layers includes situating the PID on an exposed low density buildup layer of the one or more low density buildup layers, patterning a photo resist material on the situated PID to cover portions of the PID and expose portions of the PID, exposing and developing the exposed portions of the PID to remove the exposed portions and create a localized high density buildup layer that includes the covered portions of the PID, forming one or more holes through the localized high density buildup layer, plating the one or more holes and an exposed surface of the localized high density buildup layer with a conductive material, and patterning the conductive material to form a portion of the conductive interconnect material of the high density buildup layer.

In Example 3, Example 2 can further include reducing a height of at least a portion of the low density conductive interconnect material before situating the PID on the exposed low density buildup layer of the one or more low density buildup layers.

In Example 4, Example 3 can further include, wherein reducing the height of at least a portion of the low density conductive interconnect material includes reducing the height of only a portion of the low density conductive interconnect material that is within a footprint of the localized high density buildup layers.

In Example 5, Example 4 can further include before situating the PID on the exposed layer of the one or more low density buildup layers, situating an adherence promoter on the portion of the low density conductive interconnect material that includes the reduced height.

In Example 6, at least one of Examples 2-5 can include situating and patterning a solder resist material on the another low density buildup layer to cover exposed portions of the low density buildup material and exposed portions of the low density conductive interconnect material.

In Example 7, at least one of Examples 1-6 can further include, wherein forming the one or more high density buildup layers includes situating a sacrificial material on an exposed layer of the one or more low density buildup layers, situating the high density buildup material on the sacrificial material and a portion of the one or more low density buildup layers exposed by the sacrificial material, forming one or more holes through the high density buildup material, plating the one or more holes and an exposed surface of the high density buildup material with a conductive material, and patterning the conductive material to form a portion of the high density conductive material.

In Example 8, Example 7 can further include, wherein forming the one or more low density buildup layers on the core includes forming an island of conductive interconnect material on an exposed surface of the low density interconnect material, the island electrically isolated from low density conductive interconnect material and high density conductive interconnect material.

In Example 9, Example 8 can further include creating a notch through the high density buildup material that extends from an exposed surface of the one or more high density buildup layer to a laser resist material between the high density buildup material and the high density buildup material, wherein the laser resist material includes the island, and removing the sacrificial material to create one or more localized high density buildup layers.

Example 10 can include a device that includes a core, first low density conductive interconnect material on and in the core forming an electrical pathway through the core, one or more low density buildup layers on the core and the low density conductive interconnect material, each of the one or more low density buildup layers including an inorganic buildup material and second low density conductive interconnect material in and on the inorganic buildup material, one or more localized high density buildup layers on a layer of the one or more low density buildup layers, each of the one or more localized high density buildup layers including an organic buildup material and high density conductive interconnect material in and on the organic buildup material, and wherein the one or more low density buildup layers includes a low density buildup layer on and around the one or more high density buildup layers.

In Example 11, Example 10 can further include a laser resist material on a low density buildup layer of the one or more low density buildup layers.

In Example 12, Example 11 can further include, wherein the laser resist material includes the low density conductive interconnect material and wherein the laser resist material is electrically isolated from all other low density conductive interconnect material.

In Example 13, Example 12 can further include, wherein the organic buildup material includes an epoxy-based laminate composite.

In Example 14, at least one of Examples 10-13 can further include, wherein a portion of the low density conductive interconnect material that is in direct electrical contact with the high density conductive interconnect material includes a height that is less than a height of the low density conductive interconnect material that is electrically isolated from the high density conductive interconnect material.

In Example 15, Example 14 can further include an adhesion promoter on the low density conductive interconnect material that includes the height that is less than the height of the low density conductive interconnect material that is electrically isolated from the high density conductive interconnect material.

In Example 16, Example 15 can further include, wherein the organic buildup material includes a photo-imagable dielectric.

Example 17 can include a device that includes a core including a first surface and a second surface opposite the first surface, first low density conductive interconnect material on the first and second surfaces and in the core forming an electrical pathway between the first and second surfaces, one or more low density buildup layers on the first and second surfaces of the core and the low density conductive interconnect material, each of the one or more low density buildup layers including an inorganic buildup material and second low density conductive interconnect material in and on the inorganic buildup material, one or more localized high density buildup layers on a layer of the one or more low density buildup layers on the first surface, each of the one or more localized high density buildup layers including an organic buildup material and high density conductive interconnect material in and on the organic buildup material, and wherein the one or more low density buildup layers includes a low density buildup layer on and around the one or more high density buildup layers.

In Example 18, Example 17 can further include a solder resist material on a low density buildup layer on the first surface and on a low density buildup layer on the second surface, the solder resist material patterned to cover the inorganic buildup material and expose portions of the low density conductive interconnect material.

In Example 19, at least one of Examples 17-18 can further include a laser resist material on a low density buildup layer of the one or more low density buildup layers, wherein the laser resist material includes the low density conductive interconnect material and wherein the laser resist material is electrically isolated from all other low density conductive interconnect material.

In Example 20, at least one of Examples 17-19, wherein a portion of the low density conductive interconnect material that is in direct electrical contact with the high density conductive interconnect material includes a height that is less than a height of the low density conductive interconnect material that is electrically isolated from the high density conductive interconnect material, and the device further comprises an adhesion promoter on the low density conductive interconnect material that includes the height that is less than the height of the low density conductive interconnect material that is electrically isolated from the high density conductive interconnect material, and the organic buildup material includes a photo-imagable dielectric.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which methods, apparatuses, and systems discussed herein can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A device, comprising:
a substrate;
a first dielectric layer on the substrate;
a first interconnect and a second interconnects extending through the first dielectric layer;
a second dielectric layer on the first dielectric layer, the second dielectric layer having an upper surface;
a third interconnect and a fourth interconnects extending through the second dielectric layer;
a third dielectric layer on the first dielectric layer, the third dielectric layer adjacent the second dielectric layer;
a fifth interconnect and a sixth interconnects extending through the third dielectric layer;
a fourth dielectric layer on the third dielectric layer, the fourth dielectric layer having an upper surface, the fourth dielectric layer adjacent the second dielectric layer; and
a seventh interconnect and an eighth interconnects extending through the fourth dielectric layer;
wherein the upper surface of the fourth dielectric layer is below the upper surface of the second dielectric layer.

2. The device of claim 1, wherein the substrate includes:
a core, and
a conductive structure extending through the core.

3. The device of claim 2, wherein the core includes glass.

4. The device of claim 1, wherein the fifth interconnect, the sixth interconnect, the seventh interconnect, and the eighth interconnect are positioned between the third interconnect and the fourth interconnect.

5. The device of claim 1, wherein a combined thickness of the third dielectric layer and the fourth dielectric layer is less than a thickness of the second dielectric layer.

6. The device of claim 1, wherein:
the first interconnect contacts the third interconnect,
the second interconnect contacts the fourth interconnect,
the fifth interconnect contacts the seventh interconnect, and
the sixth interconnect contacts the eighth interconnect.

7. The device of claim 1, wherein an individual one of the first dielectric layer, the second dielectric layer, the third dielectric layer, and the fourth dielectric layer, comprises a build up layer.

8. The device of claim 1, wherein an dividual one of the first dielectric layer, the second dielectric layer, the third dielectric layer, and the fourth dielectric layer comprises a photo-imagable dielectric material.

9. The device of claim 1, wherein an individual one of the first dielectric layer, the second dielectric layer, the third dielectric layer, and the fourth dielectric layer includes an organic material.

10. The device of claim 1, wherein an individual one of the first dielectric layer, the second dieletric layer, the third dielectric layer, and the fourth dielectric layer does not include silicon.

11. A device, comprising:
a first dielectric layer;
a second dielectric layer on the first dielectric layer;
a first conductive structure extending through the first dieletric layer and the second dielectric layer;
a third dielectric layer on the first dielectric layer, the third dielectric layer under at least a portion of the second dielectric layer;
a fourth dielectric layer on the third dielectric layer, the fourth dielectric layer under at least the portion of the second dielectric layer; and
a second conductive structure extending through the third dielectric layer and the fourth dielectric layer,
wherein the second conductive structure is adjacent the first conductive structure, and
wherein the first conductive structure does not extend through the third dielectic layer and the fourth dielectric layers.

12. The device of claim 11, wherein:
an upper surface of the fourth dielectric layer is below an upper surface of the second dielectric layer.

13. The device of claim 11, wherein an individual one of the first dielectric layer, the second dielectric layer, the third dielectric layer, and the fourth dielectric layer includes an organic material.

14. The device of claim 11, wherein an individual one of the first dielectric layer, the second dielectric layer, the third dielectric layer, and the fourth dielectric layer, does not include silicon.

15. The device of claim 11, wherein a combined thickness of the third dieletric layer and the fourth dielectric layer is less than a thickness of the second dielectric layer.

16. A device, comprising:
   a package substrate;
   a first dielectric layer over the package substrate;
   a second dielectric layer on the first dielectric layer;
   a first interconnect and a second interconnect in the second dielectric layer, wherein the first interconnect is adjacent to the second interconnect, and the first interconnect and the second interconnect have a first pitch;
   a third dielectric layer on the first dielectric layer and under at least a portion of the second dielectric layer; and
   a third interconnect and a fourth interconnects in the third dielectric layer, wherein the third interconnect is adjacent to the fourth interconnect, and the third interconnect and the fourth interconnect have a second pitch smaller than the first pitch.

17. The device of claim 16, further comprising:
   a fourth dielectric layer on the third dielectric layer, wherein the fourth dielectric layer under at least the portion of the second dielectric layer; and
   a fifth interconnect and a sixth interconnect in the fourth dielectric layer, wherein the fifth interconnect and the sixth interconnect have a third pitch smaller than the first pitch.

18. The device of claim 17, wherein a combined thickness of the third dielectric layer and the fourth dielectric layers is less than a thickness of the second dielectric layer.

19. The device of claim 16, wherein an individual one of the first dielectric layer, the second dielectric layer, and the third dielectric layer excludes silicon.

20. The device of claim 16, wherein an individual one of the first dielectric layer, the second dielectric layer, and the third dielectric layer includes an organic material.

* * * * *

UNITED STATES PATENT AND TRADEMARK OFFICE
CERTIFICATE OF CORRECTION

PATENT NO. : 12,062,551 B2
APPLICATION NO. : 18/118835
DATED : August 13, 2024
INVENTOR(S) : Sri Chaitra Jyotsna Chavali et al.

It is certified that error appears in the above-identified patent and that said Letters Patent is hereby corrected as shown below:

In the Claims

In Column 13, Claim 1, Line 58, delete "interconnects" and insert -- interconnect --, therefor.

In Column 13, Claim 1, Line 62, delete "interconnects" and insert -- interconnect --, therefor.

In Column 13, Claim 1, Line 66, delete "interconnects" and insert -- interconnect --, therefor.

In Column 14, Claim 1, Line 6, delete "layer;" and insert -- layer, --, therefor.

In Column 14, Claim 7, Line 29, delete "layer," and insert -- layer --, therefor.

In Column 14, Claim 8, Line 31, delete "dividual" and insert -- individual --, therefor.

In Column 14, Claim 8, Line 34, delete "photo-imagable" and insert -- photo-imageable --, therefor.

In Column 14, Claim 10, Line 40, delete "dieletric" and insert -- dielectric --, therefor.

In Column 14, Claim 11, Line 47, delete "dieletric" and insert -- dielectric --, therefor.

In Column 14, Claim 11, Line 59, delete "dielectic" and insert -- dielectric --, therefor.

In Column 14, Claim 11, Line 60, delete "layers." and insert -- layer. --, therefor.

In Column 15, Claim 15, Line 6, delete "dieletric" and insert -- dielectric --, therefor.

In Column 15, Claim 16, Line 19, delete "interconnects" and insert -- interconnect --, therefor.

Signed and Sealed this
Nineteenth Day of November, 2024

*Katherine Kelly Vidal*
Katherine Kelly Vidal
*Director of the United States Patent and Trademark Office*

In Column 16, Claim 17, Line 5, delete "under" and insert -- is under --, therefor.

In Column 16, Claim 18, Line 12, delete "layers" and insert -- layer --, therefor.